United States Patent [19]

Cuomo et al.

[11] 4,416,725
[45] Nov. 22, 1983

[54] COPPER TEXTURING PROCESS

[75] Inventors: Jerome J. Cuomo, Lake Lincolndale; Pamela A. Leary, Wappingers Falls; Dennis S. Yee, Putnam Valley, all of N.Y.

[73] Assignee: International Business Machines Corporation, Armonk, N.Y.

[21] Appl. No.: 454,922

[22] Filed: Dec. 30, 1982

[51] Int. Cl.³ .................. C23F 1/00; B44C 1/22; C03C 15/00; C03C 25/06
[52] U.S. Cl. .................. 156/635; 156/643; 156/656; 156/666; 156/345; 204/192 EC; 204/192 E; 252/79.2; 252/79.1
[58] Field of Search ............ 204/192 EC, 192 E, 298; 156/643, 646, 666, 635, 638, 656, 659.1, 345; 252/79.1, 79.2; 427/38, 39, 307, 309; 134/3, 41

[56] References Cited

U.S. PATENT DOCUMENTS

| | | | |
|---|---|---|---|
| 3,445,264 | 5/1969 | Haines | 117/47 |
| 3,573,454 | 4/1971 | Andersen | 250/41.9 |
| 3,661,747 | 5/1972 | Byrnes et al. | 204/192 |
| 4,198,278 | 4/1980 | Mehada et al. | 204/129.75 |
| 4,243,506 | 1/1981 | Ikeda et al. | 204/298 |
| 4,264,813 | 4/1981 | Chandrashekar et al. | 250/288 |
| 4,265,722 | 5/1981 | Faul et al. | 204/129.6 |

FOREIGN PATENT DOCUMENTS

| | | | |
|---|---|---|---|
| 530486 | 9/1976 | U.S.S.R. | 156/666 |

OTHER PUBLICATIONS

Hudson, "Ion Beam Texturing," J. Vac. Sci. Technol., vol. 14, #1, Jan./Feb. 1977, pp. 286–289.
Curmi et al., "Surface Texturing of Copper by Sputter Etching with Applications for Solar Selective Absorbing Surface," J. Vac. Sci. Technol. 17(6), Nov./Dec. 1980, pp. 1320–1325.
Hanak et al., "Effect of Secondary Electrons and Negative Ions on Sputtering of Films," J. Vac. Sci. Technol., vol. 13, No. 1, Jan./Feb. 1976, pp. 406–409.
Kashihira et al., "Source for Negative Halogen Ions," Rev. Sci. Instrum., vol. 48, No. 2, Feb. 1977, pp. 171–172.
Cuomo et al., "The Significance of Negative Ion Formation in Sputtering and SIMS Analysis".
Middleton et al., "A Close to Universal Negative Ion Source*," Nuclear Instruments and Methods 118 (1974) pp. 329–336.
Cuomo et al., "A New Concept for Solar Energy Thermal Conversion," Applied Physics Letters, vol. 26, No. 10, May 15, 1975, pp. 557–559.

*Primary Examiner*—William A. Powell
*Attorney, Agent, or Firm*—Carl C. Kling

[57] ABSTRACT

The invention is a room-temperature dry process for texturing copper on polyester, to improve adhesion of coatings to the copper surface through mechanical as well as chemical bonding. An iodine plasma is produced by backfilling an evacuated chamber with iodine and applying an RF potential. The iodine plasma includes both positive and negative iodine ions. Unprotected surface areas of the copper form a copper iodide; when the copper iodide is removed, the remaining surface is highly textured. The associated polyester is not damaged. The copper iodide is conveniently removed by a 10% hydrochloric acid solution which has no damaging effects on the associated polyester or on the metallic copper, or on associated polyester in a plastic laminated with copper.

9 Claims, 5 Drawing Figures

COPPER TEXTURING PROCESS

BACKGROUND OF THE INVENTION

1. Field of the Invention

The invention relates to laminated materials and particularly to a room-temperature dry process for texturing copper on plastic to improve adhesion of coatings to the copper surface through mechanical as well as chemical bonding.

2. Description of the Prior Art

Copper surfaces are generally inappropriate for adhesion of additional materials because of the smoothness of the copper surfaces, as well as the resistance of copper to chemical reaction. If it should be desirable to laminate copper with a plastic material it is desirable to provide mechanical as well as chemical bonding wherever possible.

Abrasive techniques are known for increasing the surface area and providing a mechanical bond through mechanical locking of copper to plastic.

Wet etching techniques are also known to etch the surface of copper for increasing the surface area for mechanical bonding. See, for example, USSR Author's Certificate No. 530486, Maximov and Fedorov, "Precision Etching of Copper—by dipping in iodine and potassium iodide solution followed by ammonia solution."

Wet etching techniques are inherently messy and subject to contamination from the etching bath, and in most situations require electrical contact.

Purely chemical treatment of plastic has been described, so as to achieve an interface layer which sticks to the plastic and to which succeeding layers will adhere. See, for example, U.S. Pat. No. 3,445,264, Haines, "Method and Composition for Treating the Surface of Polymeric Articles to Improve Adhesion," May 20, 1969. This type of approach is impractical in situations where a pattern of copper is to be covered with a layer of plastic in a sandwich plastic-copper-plastic, because of electrical short circuit problems as well as plastic-plastic and plastic-copper adhesion problems.

Iodine ions are known in the context of high intensity ion bombardment. See, for example, U.S. Pat. No. 4,264,813, Chandrashekhar et al, "High Intensity Ion Source Using Ionic Conductors," Apr. 28, 1981. Ion bombardment, while very useful in environments where required, is a different mechanism (essentially mechanical in nature) from the chemical mechanism of this invention. Other ions (for example, xenon ions) have been reported with similar texturizing effect. See, for example, Hudson, "Ion Beam Texturing," J. Vac. Sci. Technol. Vol. 14, No. 1, January/February 1977, pp. 286–289. Seed materials such as tungsten or aluminum oxide are commonly required in such ion beam processors, and accelerating potentials in the range 500–2000 V are required.

Copper texturizing by sputter etching has been described, at equilibrium temperatures above 300° C., in vacuo with argon at 300° V. See, for example, Curmi and Harding, "Surface Texturing of Copper by Sputter Etching With Applications for Solar Selective Absorbing Surface," J. Vac. Sci. Techno., V. 17, No. 6, November/December 1980, pp. 1320–1325. See also Cuomo, Ziegler and Woodall, Appl. Phys. Lett. 26, 557 (1975). Such copper texturizing is not appropriate for accompanying plastics because of the high temperatures.

SUMMARY OF THE INVENTION

The invention is a room-temperature dry process for texturing copper, to improve adhesion of coatings to the copper surface through mechanical as well as chemical bonding. An iodine plasma is produced by backfilling an evacuated chamber with iodine and applying an RF potential. The iodine plasma includes both positive and negative iodine ions. Unprotected surface areas of the copper form a copper iodide; when the copper iodide is removed, the remaining surface is highly textured. The associated polymer is not damaged. The copper iodide is conveniently removed by a 10% hydrochloric acid solution which has no damaging effects on the associated metallic copper, or on associated plastic laminated with copper.

DESCRIPTION OF THE PREFERRED EMBODIMENT

The process operates by creating a copper iodide surface on the metallic copper and thereafter removing the copper iodide to leave a clean, textured copper surface to which plastic will bond readily.

The copper may be in the form of copper patterns already bonded to polyester or may be copper on a temporary substrate with a photoresist defining a pattern. Other presentations of copper are also appropriate. The copper is pre-cleaned prior to iodization unless the copper is already sufficiently clean for the process.

The copper is placed in an evacuated chamber, or arrangements are made for passing the copper through the evacuated chamber for iodiation. An iodine plasma is produced by backfilling the evacuated chamber with iodine gas and applying rf potential to activate positive and negative iodine ions in the RF plasma.

Figure 1:
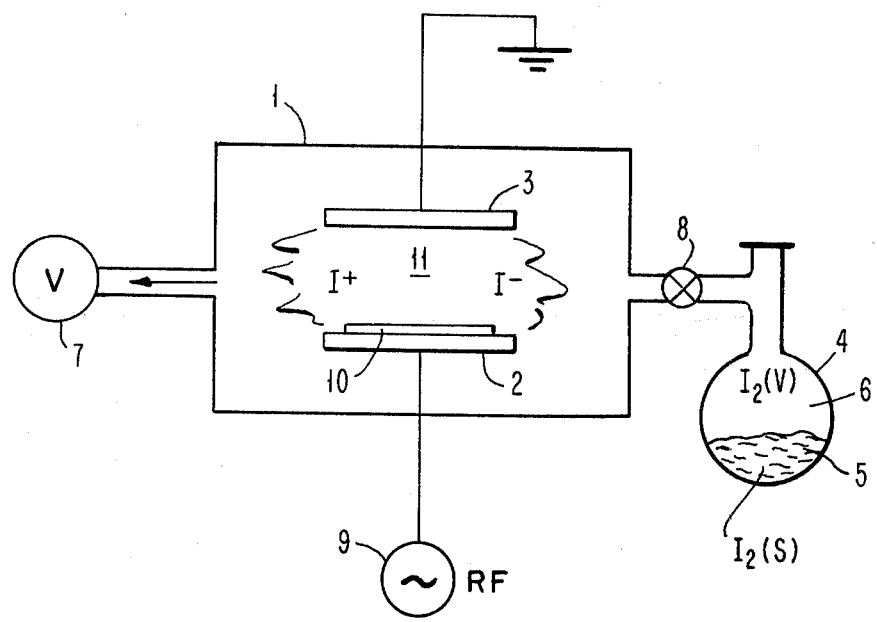
FIG. 1 is a schematic diagram of the process chamber.
Figure 2:
FIG. 2 is a photomicrograph of rough original surface copper.
Figure 3:
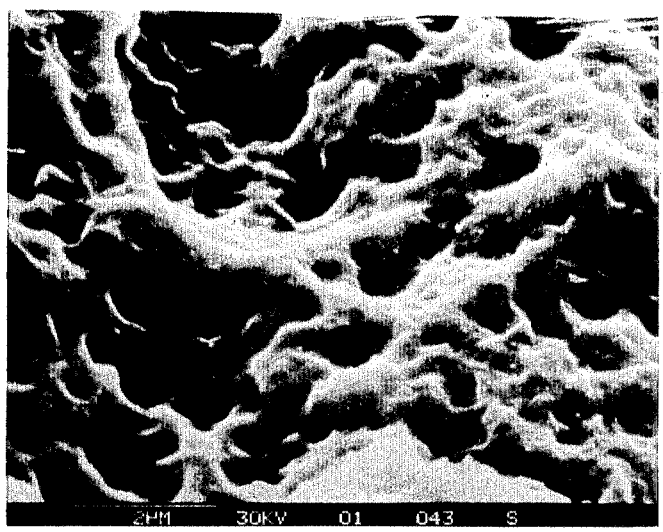
FIG. 3 is a photomicrograph of rough original surface copper after iodine plasma treatment according to the invention.
Figure 4:
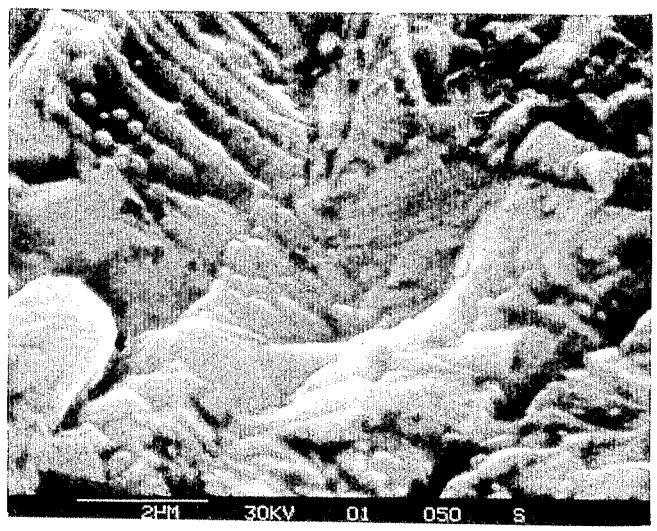
FIG. 4 is a photomicrograph of smooth original surface copper.
Figure 5:
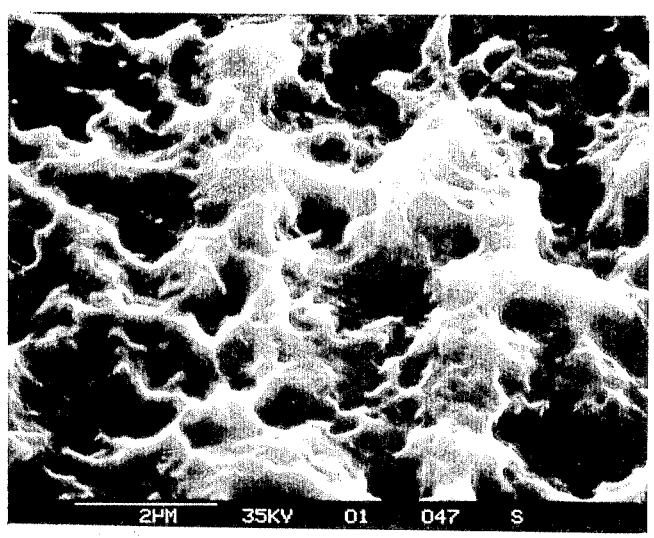
FIG. 5 is another photomicrograph of smooth original copper surface after iodine plasma treatment according to the invention.

FIG. 1 shows the apparatus in schematic presentation. Vacuum chamber 1 is supplied with RF anode 2 and ground anode 3. Iodine supply flask 4 contains a source of crystalline iodine 5; under conditions of heat and vacuum, iodine crystals 5 sublimate to form iodine gas 6. Vacuum pump 7 evacuates chamber 1 to the appropriate operating micropressure and valve 8 is opened to feed iodine gas into vacuum chamber 1. Radio frequency generator 9 provides operating potential to anode 2, upon which rests the copper sample 10. Iodine plasma 11 occurs, replete with both positive and negative iodine ions, and the resulting electrochemical activity causes rapid reaction at the unprotected copper surface, the reaction product being copper iodide.

The copper iodide is later removed by washing with a 10% HCl solution. After the copper iodide removal, the remaining surface is highly textured.

OPERATING PARAMETER CHART

| | |
|---|---|
| Vacuum chamber pressure ($I_2$) | 30 μTorr |
| Substrate temperature | Room Temperature (~20° C.) |
| $I_2$ Source Temperature | 30° C. |
| RF voltage | 300 V 13.56 MHz |
| Power | 50 Watts |
| $CuI_2$ Growth Rate | 1.4 μm/minute |
| Copper Thickness | Varies |
| Plastic (polymide, (polymethyl methacrylate, etc.) | Varies |

This process is a simple, dry process method of promoting adhesion susceptibility of copper surfaces. Both copper and plastic can be surface textured simultaneously. Byproducts of the reaction are condensable.

Copper patterns already adhering on plastic (or cemented to plastic) may be textured in a continuous or semicontinuous batch mode limited by vacuum chamber characteristics.

Copper thickness is not critical, nor is plastic thickness.

Plastic of a wide variety may be used including polymethyl methacrylate and polyimide as well as a host of other plastics. Iodine is a powerful oxidizing agent and tends either to texturize plastic surface through $CI_4$ formation or to leave the plastic surface unchanged. Any $CI_4$ formed is easily removable by the HCl wash.

What is claimed is:

1. A room temperature dry process for providing an adherent textured surface to copper
   characterized by
   placing the sample within an evacuable chamber;
   evacuating the chamber;
   backfilling the chamber with iodine vapor to a pressure of ≈30 μTorr;
   maintaining the sample at a temperature range room temperature to 50° C.;
   applying an RF voltage of approximately 300 V at 50 watts power to grow a copper iodide layer; and
   removing the copper iodide and removing the sample from the chamber.

2. The process according to claim 1,
   further characterized by
   washing the sample in a dilute acid solution to remove the copper iodide.

3. The process according to claim 2
   further characterized in that
   said temperature range is ≈30° C.

4. The process according to claim 2
   further characterized in that
   said dilute acid solution is ≈10% HCl.

5. A room temperature dry process for providing an adherent textured surface to a plastic copper laminated sample
   characterized by
   mounting the plastic copper laminate sample within an evacuable chamber;
   evacuating the chamber;
   backfilling the chamber with iodine vapor to a pressure of ≈30 μTorr;
   maintaining the sample at a temperature range below degradation temperatures for the plastic copper laminate;
   applying an RF voltage of approximately 300 V at 50 watts power to grow a copper iodide layer on the exposed copper surface; and
   removing the copper iodide and removing the plastic copper laminate sample from the chamber.

6. The process of claim 5
   further characterized in that
   said plastic is polyimide.

7. The process of claim 5
   further characterized in that
   said plastic is polymethyl methacrylate.

8. The process of claim 5
   further characterized in that
   said temperature range is ≈30° C.

9. The process of claim 5
   further characterized in that
   said RF voltage of approximately 300 V at 50 watts power is at a frequency ≈13.56 MHz.

* * * * *